United States Patent [19]

Wright

[11] Patent Number: 5,532,188

[45] Date of Patent: Jul. 2, 1996

[54] GLOBAL PLANARIZATION OF MULTIPLE LAYERS

[76] Inventor: Peter J. Wright, 6800 Arapaho Rd. #2072, Dallas, Tex. 75248

[21] Appl. No.: 220,309

[22] Filed: Mar. 30, 1994

[51] Int. Cl.⁶ .................................................. H01L 21/44
[52] U.S. Cl. ........................ 437/195; 437/189; 437/225; 437/228; 156/636.1; 156/645.1
[58] Field of Search .................................... 437/228, 195, 437/189, 225; 156/636, 645

[56] References Cited

U.S. PATENT DOCUMENTS

| | | | |
|---|---|---|---|
| 5,015,602 | 5/1991 | Van Der Plas et al. | 437/228 |
| 5,212,114 | 5/1993 | Grewal et al. | 437/231 |
| 5,284,804 | 2/1994 | Moslehi | 437/228 |
| 5,294,562 | 3/1994 | Lur et al. | 437/61 |
| 5,302,551 | 4/1994 | Iranmanesh et al. | 437/194 |
| 5,312,512 | 5/1994 | Allman et al. | 437/228 |
| 5,326,718 | 7/1994 | Klose et al. | 437/31 |
| 5,332,467 | 7/1994 | Sune et al. | 437/225 |

OTHER PUBLICATIONS

T. H. Daubenspeck, J. K. DeBrosse, C. W. Koburger, M. Armacost, and J. R. Abernathey, *Planarization of ULSI Topography over Variable Pattern Densities*, J. Electrochem. Soc. vol. 138, No. 2, Feb. 1991.

Andrew Nagy, John Helbert, *Planarized Inorganic Interlevel Dielectric for Multilevel Metallization—Part I*, Solid State Technology, pp. 53–56, Jan. 1991.

*Primary Examiner*—Olik Chaudhuri
*Assistant Examiner*—Long Pham

[57] ABSTRACT

A method is disclosed for performing global planarization of the top layer of a structure having multiple patterned layers, during fabrication of an integrated circuit (10). An integrated circuit fabricated using the method is also disclosed. The method involves globally planarizing an integrated circuit (10) having a plurality of patterned layers (14, 18) interleaved with a plurality of unpatterned layers (16, 20). Each of the patterned layers (14, 18) is associated with a pattern mask (22, 24). The topmost layer (20) can be an unpatterned layer. Next, the pattern masks (22, 24) are combined to form a planarizing block mask (44) by merging a weighted inverse spatial interpolation of each pattern mask (22, 24). A planarizing block layer (60) is then formed on top of the topmost layer (20) using the planarizing block mask (44). Next, an unpatterned planarizing film layer (62) is formed on top of the planarizing block layer (60). Finally, the film layer (62), the block layer (60) and the topmost layer (20) are etched to cause global planarization of the topmost layer (20).

16 Claims, 3 Drawing Sheets

40

42

46

48

50

52

44, 45

54

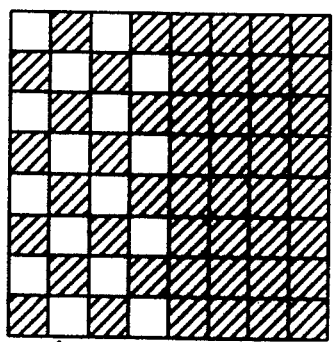
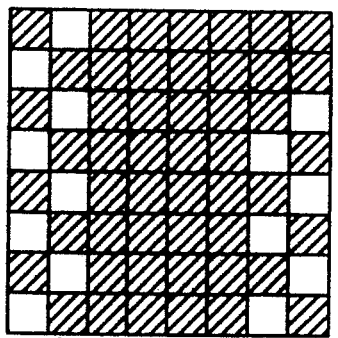
FIG. 10A  FIG. 10B
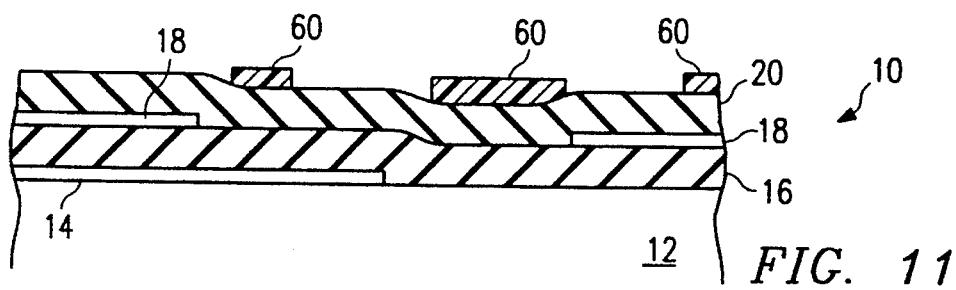
FIG. 11
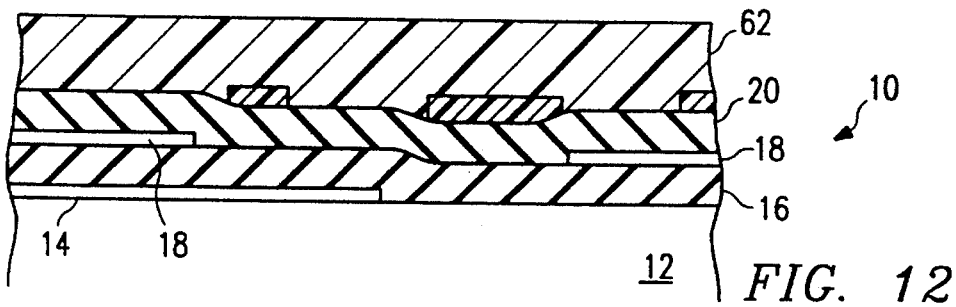
FIG. 12
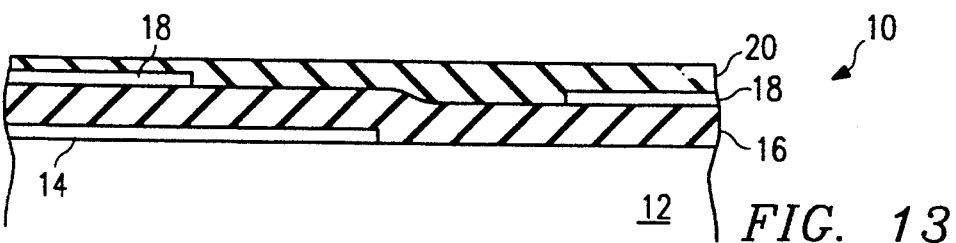
FIG. 13
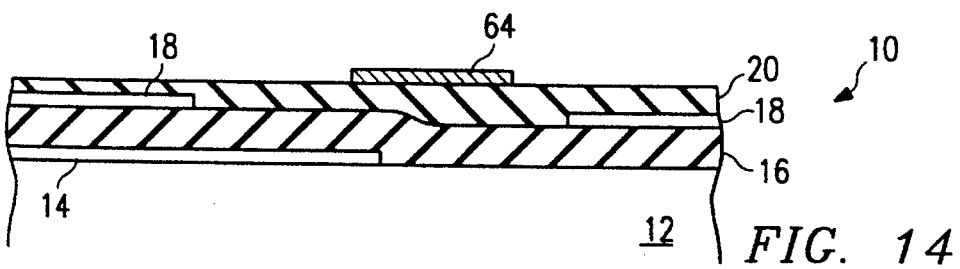
FIG. 14

GLOBAL PLANARIZATION OF MULTIPLE LAYERS

TECHNICAL FIELD OF THE INVENTION

This invention relates generally to integrated circuit fabrication, and more particularly, to a method for achieving global planarization of the top layer of a multiple layer nonplanar structure during fabrication of integrated circuits.

BACKGROUND OF THE INVENTION

As device dimensions in integrated circuits continue to decrease, planarization of topographical features becomes more critical. When exposing a pattern using photolithography, large differences in step height across the exposed area will cause some of the pattern to be out of focus. This effect results from the limited depth of focus available with existing photolithography technology. The problem is most serious for devices smaller than 1 micron. Existing technology normally can maintain a good depth of focus between plus or minus 0.3 microns. When portions of the exposed areas are out of focus, metal leads may be open or the "via holes" may not open up uniformly.

For submicron-sized devices, therefore, it is desirable to planarize topographical features before fabricating a subsequent patterned layer. Engineers have proposed two principle methods for achieving global planarization: chem-mechanical polishing and patterned resist etchback. In chem-mechanical polishing, a slurry film etches a wafer while a pad is used to apply mechanical pressure and increase the etch rate. Areas on the wafer that are "higher" on the surface are etched more quickly. Unfortunately, chem-mechanical polishing does not give ideal global planarization. Instead, this process causes pattern density effects which are more significant as die sizes increase.

Patterned resist etchback involves globally planarizing a structure after a patterned layer has been formed and an oxide or dielectric layer has been deposited on top of the patterned level. The oxide layer tends to be raised in the vicinity of structures on the patterned layer and tends to have valleys where there is no structure on the patterned layer. The patterned resist etchback process planarizes the oxide level.

The first step in the patterned resist etchback process is to deposit a reverse pattern of the patterned layer on top of the oxide. This layer, known as the planarizing block layer, can be formed using a negative of the mask used to form the patterned layer. After the reverse pattern has been deposited, the resulting layer comprises structures that fill the valleys of the oxide layer. Next, a layer of photoresist is spun on, thus providing a substantially planarized surface. The substantially planarized surface is then etched using a process that will etch the photoresist and oxide at the same rate, thus producing a planarized oxide surface. After the oxide has been planarized, additional patterned layers may be deposited on top of the oxide layer.

Although patterned resist etchback is a good method to achieve global planarization, it adds a significant number of processing steps as one must perform the method after forming each patterned level. These additional processing steps also increase the amount of chemicals needed to fabricate an integrated circuit. As a result, patterned resist etchback causes both the cost and time of production to increase.

SUMMARY OF THE INVENTION

The present invention avoids the need to perform patterned resist etchback after fabricating each patterned layer. One aspect of the invention is a method for performing global planarization of the top layer of a nonplanar structure having multiple patterned layers using patterned resist etchback techniques. First, a plurality of patterned layers are formed and are interleaved with a plurality of unpatterned layers. The patterned layers are formed using a mask and the topmost layer will normally be an unpatterned layer. The pattern masks used in forming the patterned layers are then combined to form a planarizing block mask. The pattern masks are combined by merging a weighted inverse spatial interpolation of each pattern mask. Next, a planarizing block layer is formed on top of the topmost layer using this planarizing block mask. An unpatterned planarizing film layer is then formed on top of the planarizing block layer. The film layer, the block layer, and the topmost unpatterned layer are then etched to cause planarization of the topmost unpatterned layer. The detailed description of the invention discloses several variations of the invention.

An important technical advantage of the present invention is that global planarization can be performed on the top layer of a nonplanar structure having multiple patterned layers using patterned resist etchback techniques. Because multiple layers can be planarized simultaneously, patterned resist etchback need not be performed after fabricating each patterned layer. Another technical advantage of the invention, therefore, is that the invention saves processing steps. Because the invention saves processing steps, it also saves processing time and reduces the cost of fabricating integrated circuits. Because planarization need not be performed after fabricating each patterned layer, the invention also decreases the amount of chemicals required to fabricate a device.

BRIEF DESCRIPTION OF THE DRAWINGS

For a more complete understanding of the present invention, and the advantages thereof, reference is now made to the following descriptions taken in conjunction with the accompanying drawings, in which:

FIGS. 10A–10B illustrate the inverse of the weighted spatial interpolations illustrated in FIGS. 8A–8B;

FIG. 11 illustrates the integrated circuit of FIG. 1 after a planarizing block layer has been formed on top of the topmost unpatterned layer utilizing the planarizing block mask illustrated in FIG. 6;

FIG. 12 illustrates the structure of FIG. 11 with an unpatterned planarizing film layer formed on top of the planarizing block layer and the unpatterned layer;

FIG. 13 illustrates the structure of FIG. 12 after it has been etched to cause global planarization;

FIG. 14 illustrates an integrated circuit made in accordance with the teachings of the present invention.

DETAILED DESCRIPTION OF THE INVENTION

The preferred embodiment of the present invention and its advantages are best understood by referring to FIGS. 1–14 of the drawings, like numerals being used for like and corresponding parts of the various drawings.

Figure 1:
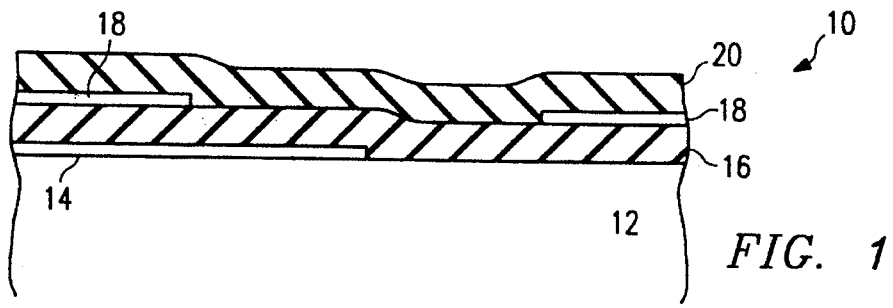
FIG. 1 illustrates a portion of an integrated circuit having a plurality of patterned layers formed thereon.

FIG. 1 illustrates a partially completed cross section of an integrated circuit 10. Integrated circuit 10 comprises substrate 12, first patterned layer 14, first unpatterned layer 16, second patterned layer 18 and second unpatterned layer 20. First patterned layer 14 is formed on substrate 12 using a mask (not shown). First patterned layer 14, for example, can be a metal layer.

First unpatterned layer 16 is formed on top of first patterned layer 14. First unpatterned layer 16 can, for example, be an oxide or dielectric layer. Similarly, second patterned layer 18 can be formed on top of first unpatterned layer 16 and second unpatterned layer 20 on top of second patterned layer 18. Second patterned layer 18 could also, for example, be a metal layer, while second unpatterned layer 20 could be an oxide or dielectric layer. To accurately fabricate additional patterned layers, a designer may desire to globally planarize second unpatterned layer 20.

The present invention allows a designer to globally planarize the top layer of a nonplanar structure having multiple patterned layers. Integrated circuit 10 has a plurality of patterned layers interleaved with a plurality of unpatterned layers. Integrated circuit 10 has two patterned layers, but the present invention can easily be extended to planarize structures having more than two patterned layers formed between planarizing steps. The topmost layer is normally an unpatterned layer.

In accordance with the teachings of the present invention, the topmost layer is planarized using a new type of patterned resist etchback technique. Because the top layer of a structure having multiple patterned layers is being planarized, the inverse of the mask used to form the patterned layers may not be used directly to form the planarizing block layer as with existing photoresist etchback techniques. Instead, a new planarizing block mask should be created using information from each of the masks used to form the patterned layers.

Figure 8A:
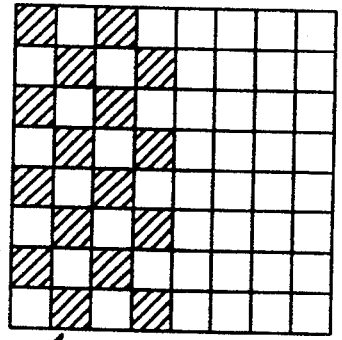
FIGS. 8A–8B illustrate a weighted spatial interpolation of the masks illustrated in FIGS. 2A–2B using the template masks of FIGS. 4A–4C.
Figure 8B:
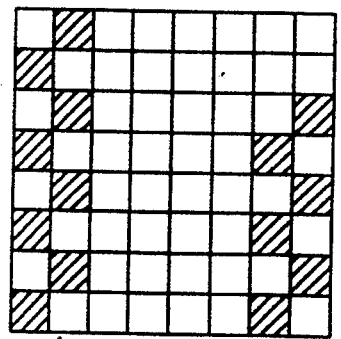
Figure 9:
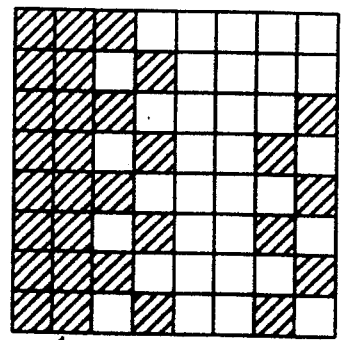
FIG. 9 illustrates an intermediate mask formed by summing the weighted spatial interpolations illustrated in FIGS. 8A–8B.

The discussion below describes a method for achieving planarization of multiple patterned layers using a planarizing block mask. There are several different ways to make the planarizing block mask in practicing the invention. The discussion accompanying FIGS. 2a, 2b through 6 describes one method of making the mask. The discussion accompanying FIGS. 8a, 8b and 9 illustrates an alternative method of making the mask, while the discussion of FIG. 10 illustrates yet another alternative for making the mask. Other equivalent methods of making the mask can be readily imagined without departing from the scope of the present invention. After describing ways of making the blocking mask, FIGS. 11–13 illustrate an application of the method to integrated circuit 10. FIG. 14 illustrates an integrated circuit made in accordance with the teachings of the present invention.

The planarizing block mask used to form the planarized block layer may be formed by combining the pattern masks that were used to form the patterned layers comprising the structure to be planarized. These masks may be combined by merging a weighted inverse spatial interpolation of each pattern mask.

Figures 2A, 2B:
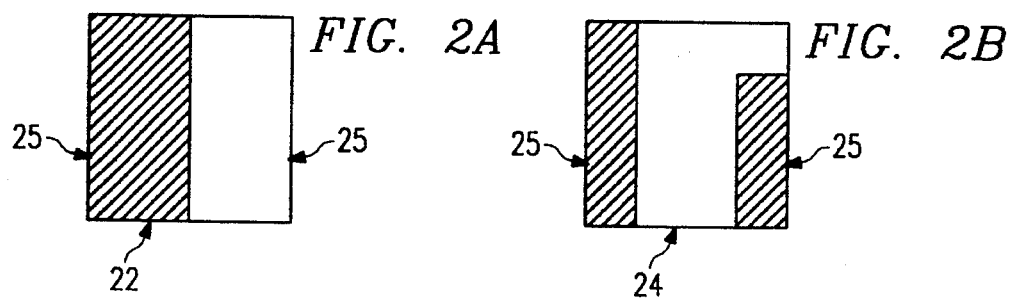
FIGS. 2A–2B illustrate a top view of the masks used to form the patterned layers in the integrated circuit illustrated in FIG. 1.

FIG. 2a illustrates a top view of first pattern mask 22 and FIG. 2b illustrates a top view of second pattern mask 24. Each illustrated mask is a portion of a complete mask used to form the patterned layers of integrated circuit 10. One section of first pattern mask 22 was used to form first patterned layer 14 of integrated circuit 10 while second pattern mask 24 was used to form second patterned layer 18 in integrated circuit 10. Arrows 26 indicate the portion of first pattern mask 22 and second pattern mask 24 used to form the vertical slice of integrated circuit 10 that is illustrated in FIG. 1.

The shaded areas in first pattern mask 22 and second pattern mask 24 represent areas where material will be deposited when first patterned layer 14 and second patterned layer 18 are formed. The clear regions of the masks represent areas where no material is created when forming first patterned layer 14 and second pattern layer 18. The illustrated masks may be used with a positive photoresist. Alternatively, an inverse of first pattern mask 22 and second pattern mask 24 could be used with a negative photoresist. In an inverse mask, the shaded areas of first pattern mask 22 and second pattern mask 24 would become clear while the clear areas would become shaded. The present invention can be used with either positive or negative photoresist.

First pattern mask 22 and second pattern mask 24 will normally be created on a computer and be represented by a series of boolean values corresponding to specific points on the mask. A shaded area is normally represented as a boolean TRUE while a clear area is normally represented by a boolean FALSE. These representations, however, could easily be interchanged.

Figures 3A, 3B:
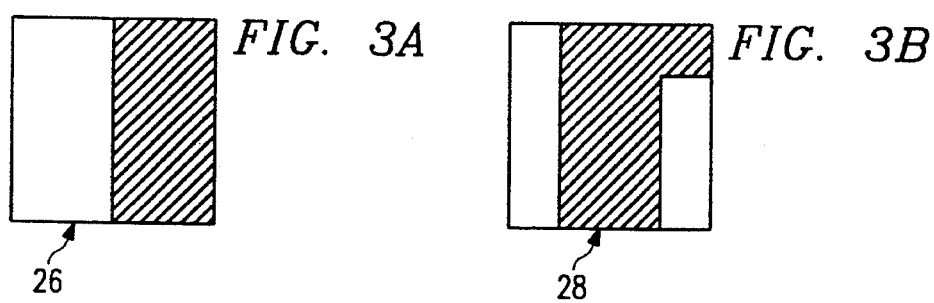
FIGS. 3A–3B illustrate the inverse of the masks of FIGS. 2A–2B, respectively.

The first step of the first method for making the planarizing block mask is to create inverses of each pattern mask. FIG. 3a illustrates first inverse mask 26 and FIG. 3b illustrates second inverse mask 28. First inverse mask 26 is an inverse of first pattern mask 22 while second inverse mask 28 is an inverse of second pattern mask 24. As described, an inverse mask can be formed by reversing the shaded portions and the clear portions. Where masks are stored on a computer, all boolean true values may be changed to false and all boolean false values may be changed to true. As an alternative to using first inverse mask 26 and second inverse mask 28, first pattern mask 22 and second pattern mask 24 could be utilized as inverse masks by using photoresist of an opposite polarity.

The step of taking an inverse may thus consist of reversing the shaded areas and the clear areas. Otherwise, an inverse mask could be created by using the pattern mask, and using photoresist when forming the planarizing block with a polarity opposite to that used to form the patterned layers. Taking the inverse of the pattern masks to form inverse masks, therefore, encompasses both (1) actually taking the inverse of the pattern masks as described above or (2) leaving the pattern masks unchanged and using the opposite polarity of photoresist when forming the planarizing block layer.

Figures 4A, 4B, 4C:
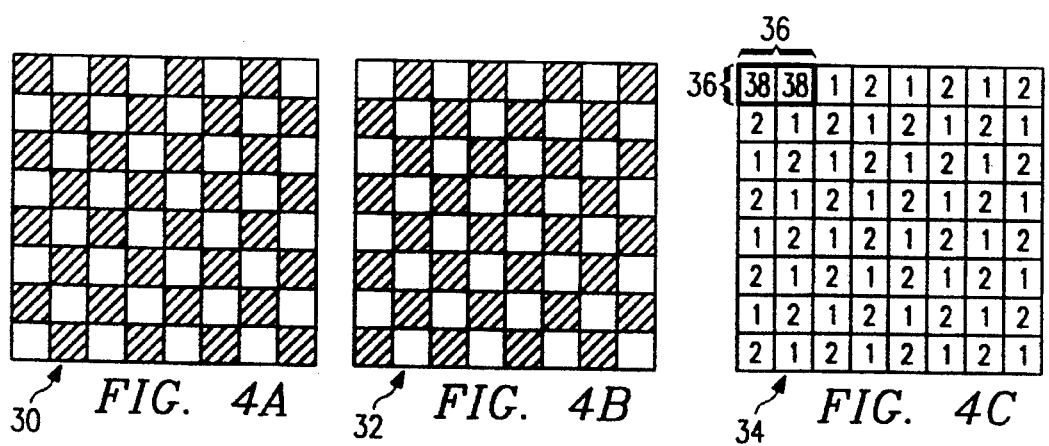
FIGS. 4A–4C illustrate several template masks used with the present invention.

Another step in the first method for forming a planarizing block mask is forming template masks. FIG. 4a illustrates first template mask 30 and FIG. 4b illustrates second template mask 32. Each template mask corresponds to a specific patterned layer. A template mask may be created for each patterned layer. The template for a particular layer is used to create a weighted spatial interpolation of the pattern mask or inverse mask for that layer. In the first method for making the planarizing block mask, the template masks can be used to form a weighted spatial interpolation of the inverse masks.

Patterned resist etchback for a structure with single patterned layer, involves forming a planarizing block only in locations where no structure has been formed on the patterned layer. In the present invention, however, it should be considered whether material has been formed on a multiplicity of patterned layers. To achieve planarization, the size of the planarizing blocks can be varied depending upon the number of patterned layers underlying a specific vertical slice of the planarizing block layer. Forming a planarizing block mask is thus more complex when globally planarizing a structure have multiple patterned layers than when globally planarizing a structure having a single patterned layer.

Integrated circuit 10 illustrated in FIG. 1, provides an example of this phenomena. First patterned layer 14 has approximately the same thickness as second patterned layer 18. Given this configuration, four possibilities exist. First, there can be vertical slices of integrated circuit 10 where no structure has been formed in either first patterned layer 14 or second patterned layer 18. In these vertical slices, a planarizing block should cover the entire vertical slice.

Second, there can be vertical slices of integrated circuit 10 where structure appears both on first patterned layer 14 and on second patterned layer 18. In this situation, no planarizing block should be formed in this vertical slice as these will be the highest areas of topography.

Third, there can be vertical slices of integrated circuit 10 where structure has been formed on first patterned layer 14 but not on second patterned layer 18. In this case, a planarizing block should cover one half of the surface area of the vertical slice. By covering only one half of the surface area, this planarizing block will lead to better local planarization around this vertical slice.

Fourth, there can be vertical slices of integrated circuit 10 where structure has been formed on second patterned layer 18 but not on first patterned layer 14. As was the case for the third possibility, a planarizing block having half of the surface area of the vertical slice should be formed for this vertical slice.

This method of forming a planarizing block layer can be extended to form a planarizing block layer for more than two patterned layers and/or for layers of different thicknesses. Where more than two layers are present, the surface area of the planarizing block should be sized according to the number of patterned layers in the vertical slice on which structure has been formed. For example, in an integrated circuit with three patterned layers, the planarizing block mask could have a surface area of 0/3, 1/3, 2/3 or 3/3 of the surface area of the vertical slice depending upon whether structure appears on 3, 2, 1, or 0 patterned layers respectively.

For integrated circuits where the thickness of the patterned layers varies, the surface area of the planarizing block may be varied depending upon the thickness of the patterned structures underlying the vertical slice. The method involves varying the surface area of the planarizing block in proportion to the thickness of the particular layer underlying the vertical slice. This method is more fully described below in connection with FIG. 7.

To vary the area of the planarizing blocks, the planarizing block mask may be formed by combining a weighted spatial interpolation of the inverse masks of each patterned layer. Taking a weighted spatial interpolation of the inverse masks involves sampling each mask at specific locations and combining the samples to form the planarizing block mask. To form the weighted spatial interpolation of the inverse mask, template masks are 'multiplied' by the inverse masks. Here, the term 'multiplying' refers to taking the logical AND between the template mask and the corresponding inverse mask for a specific patterned layer.

The general procedure for forming a template mask is first described in general terms. After this method has been described, a specific example is provided by referring to FIGS. 4a–4c. To create the template masks, a global template mask can be created that comprises a grid of similarly shaped units. Each unit may then be subdivided into a plurality of subunits. Each unit has at least one subunit associated with each patterned layer that is being planarized.

For example, where two patterned layers are being planarized, at least one subunit in each unit may be associated with each of the two patterned layers. In addition, each subunit is normally associated with one and only one patterned layer. For the example where two patterned layers are being planarized, at least two subunits may be used where one subunit may be associated with one layer and the other subunit may be associated with the other patterned layer. The area of the subunits may be weighted based upon the thickness of the patterned layers.

After the global template mask has been designed, a layer template mask associated with each patterned layer is created. The layer template mask for a specific layer may comprise a series of boolean values associated with each subunit of the global template mask. All boolean values in a layer template mask for a specific layer have a value of false except for the boolean values associated with the subunits that were associated with that specific patterned layer when creating the global template mask.

As an example, when creating layer template masks in attempting to planarize two patterned layers, a first layer template mask associated with the first patterned layer is formed and a second layer template mask associated with a second patterned layer is formed. The global template mask may be divided into at least two subunits where one subunit may be associated with the first patterned layer and one subunit may be associated with the second patterned layer. All boolean values in the first template mask are normally set to false except for those boolean values for those subunits that were associated with the first patterned layer. Similarly, all boolean values are normally set to false in the second layer template mask except for those boolean values for those subunits that were associated with the second patterned layer when creating the global template mask.

The method of creating the layer template masks is more easily understood by referring to FIGS. 4a–4c. As discussed above, FIG. 4a illustrates first layer template mask 30 and FIG. 4b illustrates second template mask 32. In addition, FIG. 4c illustrates global template mask 34. Global template mask 34 has been divided into a grid of similarly shaped units 36. Global template mask 34 has four columns of eight units 36 in each column. Each unit 36 has been divided into two subunits 38. More than two subunits could be used without departing from the scope of the present invention as long as each subunit is assigned to one and only one patterned layer and at least one subunit in each unit is assigned to each patterned layer. In global template mask 34, those subunits delineated with the label 1 have been assigned to a first patterned layer while those units labeled with the label 2 have been assigned to a second patterned layer. For the subunits 28 that have the labels 38 in their interior, the leftmost subunit is assigned to the first patterned layer while the rightmost subunit is assigned to the second patterned layer.

First layer template mask 30 can be formed according to the method described above. Given global template mask 34, the subunits 38 of first layer template mask 30 have all been assigned a boolean value of FALSE, except for the boolean values associated with those subunits that were associated with the first patterned layer in global template mask 34. In first layer template mask 30 illustrated in FIG. 4a, a boolean value of TRUE is indicated by a shaded subunit while a boolean value of FALSE is indicated by an unshaded subunit.

Similarly, second layer template mask 32 can be created by setting all boolean values associated with each subunit of global template mask 34 to FALSE except for those subunits that were associated with the second patterned layer when creating global template mask 34.

Thus, a layer template mask is associated with each patterned layer. In the first method of making the planarizing block mask, a weighted spatial interpolation of each inverse mask is created. A weighted spatial interpolation for a specific patterned layer may be created by taking the logical AND between the inverse mask and the layer template mask associated with the particular patterned layer. For example, to create the weighted spatial interpolation for the first layer, the logical AND may be taken between the inverse mask for the first patterned layer and the layer template mask for the first patterned layer.

Figure 5A:
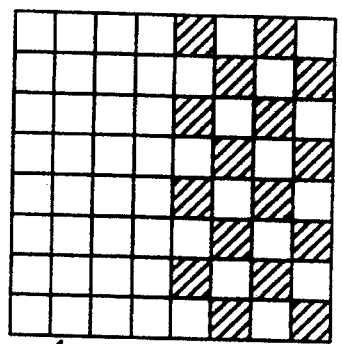
FIGS. 5A–5B illustrate a weighted spatial interpolation of the masks illustrated in FIGS. 3A–3B and formed using the template masks of FIGS. 4A–4C.
Figure 5B:
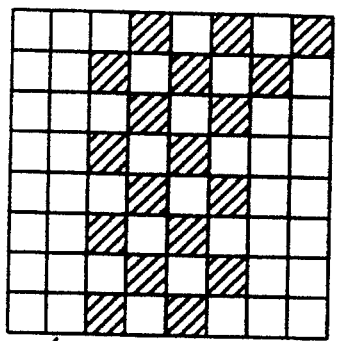

FIG. 5a illustrates first weighted spatial interpolation 40 and FIG. 5b illustrates second weighted spatial interpolation 42. First weighted spatial interpolation 40 was created by multiplying first inverse mask 26 by first template mask 30. In other words, first weighted spatial interpolation 40 was created by multiplying the inverse mask associated with the first patterned layer by the layer template mask associated with the first patterned layer. First inverse mask 26 can be represented by a series of boolean values each associated with a subunit of global template mask 34. Again, the term 'multiplying' refers to taking the logical AND between the two masks.

Similarly, second weighted spatial interpolation 42 was created by multiplying second inverse mask 28 by second layer template mask 32. The shaded areas in first weighted spatial interpolation 40 and second weighted spatial interpolation 42 represent areas with a boolean value of TRUE while the unshaded areas represent a boolean value of FALSE.

First weighted spatial interpolation 40 and second weighted spatial interpolation 42 may also be referred to as weighted inverse spatial interpolations of the first and second pattern masks, respectively. This term refers to the fact that first weighted spatial interpolation 40 and second weighted spatial interpolation 42 represent weighted spatial interpolations of the inverse of first pattern mask 22 and second pattern mask 24.

The final step of the first method for creating the planarizing block mask involves summing the weighted spatial interpolations of each pattern mask. Here, summing refers to taking the logical OR between the weighted spatial interpolations. In the general case, the weighted inverse spatial interpolations are summed to form the planarizing block mask.

Figure 6:
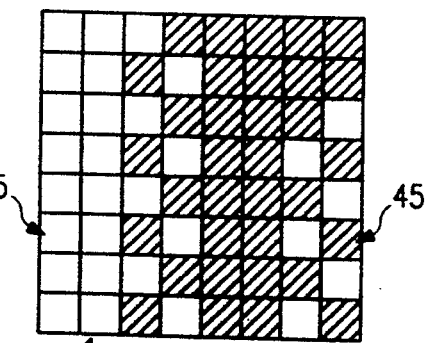
FIG. 6 illustrates a planarizing block mask made in accordance with the teachings of the present invention using the weighted spatial interpolations illustrated in FIGS. 5A–5B.

For example, FIG. 6 illustrates patterned block mask 44 created using first weighted spatial interpolation 40 and second weighted spatial interpolation 42. To form patterned block mask 44, first weighted spatial interpolation 40 may be summed with second weighted spatial interpolation 42. In other words, the weighted spatial interpolation of the inverse masks associated with each pattern level may be summed. This process is also known as merging a weighted inverse spatial interpolation of each pattern mask. Arrows 46 delineate the slice of pattern block mask 44 used to form the pattern block layer for integrated circuit 10 as illustrated in FIG. 11. FIG. 11 is more fully described below.

For the template masks illustrated in FIGS. 4a–4b, the above discussion assumes that the first patterned layer has approximately the same thickness as the second patterned layer. The template masks can be formed differently when the patterned layers have different thicknesses. In a general case, where the patterned layers have different thicknesses, the subunits can be designed to have an area proportional to the area of the unit such that the ratio of the area of a particular subunit to the area of the unit is approximately equal to the ratio of the thickness of the patterned layer with which the particular subunit is associated to the sum of the thicknesses for the plurality of patterned layers that are being globally planarized.

For example, in planarizing two layers where the first layer has a thickness of three times the thickness of the second layer, the area of the subunit associated with the first sublayer could be three times as large as the area of the subunit associated with the second layer.

Figure 7A:
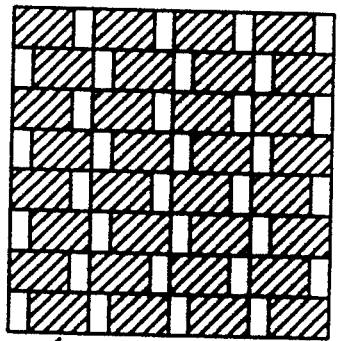
FIGS. 7A–7B illustrate alternative template masks that could be used with the present invention.
Figure 7B:
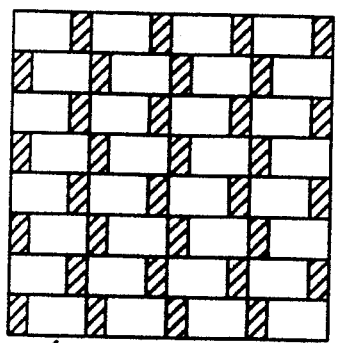

FIG. 7a illustrates an example of a first template mask 46 and FIG. 7b illustrates a second template mask 48 for patterned layers of different thicknesses. This example assumes that one is attempting to planarize two patterned layers where the first patterned layer has a thickness approximately three times as large as the thickness of the second patterned layer. As illustrated, the units associated with the first patterned layer have a boolean value of TRUE in first template mask 46 have been shaded, while those boolean values not associated with the first patterned layer in first template mask 46 remain unshaded. Similarly, those subunits associated with the second patterned layer have been a boolean value of TRUE in second template mask 46 while those subunits not associated with the second patterned layer have been set to a boolean value of FALSE and remain unshaded. As illustrated in FIGS. 7a and 7b, those subunits associated with the first patterned layer consume approximately ¾ of the area of a unit while those subunits associated with the second patterned layer occupy only approximately ¼ of the surface of a unit.

Where the patterned layers have equal thickness, the subunits will have equal area in the template mask. This method of making a template mask can be extended to situations involving planarization of more than two levels. For example, in planarizing three layers simultaneously, where the first and second layer have equal thickness and the third layer is twice as thick as the first and second layer, the template mask will have subunits covering ¼ of the surface area of a unit for the first and second layer and subunits covering ½ of the area of a unit for the third layer.

The second method of making the planarizing block mask involves summing a weighted spatial interpolation of each pattern mask to form an intermediate mask. Next, the inverse of the intermediate mask may be taken to form the planarizing block mask.

As above, taking the inverse of the intermediate mask normally involves changing boolean TRUE values to FALSE and boolean FALSE values to TRUE. Physically, this has the effect of changing shaded areas on the mask to unshaded areas and unshaded areas on the mask to shaded areas. Alternatively, the inverse of the intermediate mask can be taken to form the planarizing block mask simply by leaving the intermediate mask unchanged and using a polarity of photoresist to form the planarizing block layer opposite to that of the photoresist used to form the patterned layers. These two methods are equivalent.

For example, the second method of forming a planarizing block mask can be illustrated using first pattern mask 22 and second pattern mask 24 of FIGS. 2a–2b. First a weighted spatial interpolation of each pattern mask is formed. To create the weighted spatial interpolation of each pattern mask, a global template mask and a layer template mask for each layer may be created, as described above. Accordingly, first layer template mask 30 and second layer template mask 32 could be used. Next, a weighted spatial interpolation of each pattern mask may be created by multiplying the pattern mask for a particular layer by the layer template mask associated with that layer.

FIG. 8a illustrates first weighted spatial interpolation 50 and FIG. 8b illustrates second weighted spatial interpolation 52 using this method. First weighted spatial interpolation 50 may be formed by multiplying first layer template mask 30 by first pattern mask 22. Second weighted spatial interpolation 52 may be formed by multiplying second layer template mask 32 by second pattern mask 24. Again, the step of multiplying two masks comprises taking the logical AND of the two masks.

The next step in the second method for creating a planarizing block mask is to sum the weighted spatial interpolations to form an intermediate mask. Again, summing comprises taking the logical OR between the weighted spatial interpolations.

FIG. 9 illustrates an intermediate mask 54 formed in accordance with the second method of creating a planarizing block mask. Intermediate mask 54 has been formed by summing first weighted spatial interpolation 50 and second weighted spatial interpolation 52.

The final step in forming a planarizing block mask in accordance with the second method is to take the inverse of the intermediate mask to form the planarizing block mask. If a polarity of photoresist is used that is opposite to the polarity of the photoresist used to form the patterned layers, the intermediate mask can be used as the inverse. In other words, the intermediate mask becomes the planarizing block mask. If photoresist with the same polarity is used as that used to form the patterned layers, the planarizing block mask may be formed by taking the boolean inverse of the intermediate mask. Either method is equivalent. Referring again to FIG. 9, taking the inverse of intermediate mask 54 results in pattern block mask 44 of FIG. 6.

The third method of forming a planarizing block mask involves creating a weighted spatial interpolation of each pattern mask. The inverse of each of the weighted spatial interpolations is then taken to form inverse interpolation masks. Finally, the planarizing block mask may be formed by multiplying the inverse interpolation masks.

Applying this method of making a planarizing block mask to first pattern mask 22 and second pattern mask 24 of FIGS. 2a–2b, a weighted spatial interpolation of each pattern mask is first created. The first weighted spatial interpolation 50 of first pattern mask 22 is illustrated in FIG. 8a, while FIG. 8b illustrates second weighted spatial interpolation 52 of second pattern mask 24. Next, the inverse of these weighted spatial interpolations may be taken to form inverse interpolation masks. FIG. 10a illustrates first inverse interpolation mask 56 and FIG. 10b illustrates second inverse interpolation mask 58. First inverse interpolation mask 56 may be formed by taking the inverse of first weighted spatial interpolation 52 while second inverse interpolation mask 58 may be formed by taking the inverse of second weighted spatial interpolation 52.

Finally, the planarizing block mask may be formed by multiplying the inverse interpolation masks. For example, planarizing block mask 44 of FIG. 6 can be formed by multiplying first inverse interpolation mask 56 by second inverse interpolation mask 58.

Due to problems aligning the masks for various layers, the planarizing block structures in the planarizing block layer will normally be made slightly smaller than they otherwise would be. The size of the shaded, or TRUE areas of the planarizing block mask can be adjusted or the size of the original pattern masks can be adjusted. For example, in the first method discussed above, the positive areas on each of the pattern masks could be enlarged to form enlarged masks and then the inverse of the enlarged masks could be taken to form inverse masks. The positive areas are the shaded areas in the pattern masks for each layer. By enlarging these areas, the size of the pattern block areas shrink when the inverse of the enlarged mask is taken.

After a planarizing blocking mask has been formed using any of the above methods or their equivalents, a planarizing block layer may be formed on top of the topmost layer of the integrated circuit. As noted above, the topmost layer is normally an unpatterned layer. FIG. 11 illustrates planarizing block layer 60 formed on top of the topmost layer, which is second unpatterned layer 20. The topmost unpatterned layer is normally thicker than the sum of the thicknesses of the patterned layers. The thickness of planarizing block layer 60 is normally approximately the same as the sum of the thicknesses of the patterned layers in the structure that is being planarized.

In the example illustrated in FIG. 11, patterned layer 60 is approximately the same thickness as the sum of the thicknesses of first patterned layer 14 and second patterned layer 18. Thicker photoresist could be used if desired. If thicker photoresist is used, the area of each planarizing block could be reduced proportionally to the increase in thickness of the photoresist. The desired thickness of the photoresist depends upon the minimum surface area of a planarizing block and can be determined empirically for different applications. The size of each unit on the template mask will also depend upon the application. If the unit size is too small, there may be problems adding the planarizing layer of photoresist.

FIG. 11 illustrates planarizing block layer 60 formed on top of the topmost layer using the planarizing block mask. The slice of integrated circuit 10 illustrated in FIG. 11 was formed using the slice of first pattern mask 22 and second pattern mask 24 denoted by the arrows 25 in FIGS. 2a–2b. The portion of planarizing block mask 44 used to form the vertical slice of planarizing block layer 60 illustrated in FIG. 11 indicated by arrows 45 in FIG. 6.

After the planarizing block layer has been formed on top of the topmost layer, an unpatterned planarizing film layer can be formed on top of the planarizing block layer. FIG. 12 illustrates unpatterned planarizing film layer 62 formed on top of planarizing block layer 60. Planarizing block layer 60 normally comprises photoresist and unpatterned planarizing film layer 62 also comprises a spun-on layer of photoresist. Unpatterned planarizing film layer 62 is substantially planar, both locally and globally.

The final step in globally planarizing the structure having multiple patterned layers is etching the film layer, block layer and topmost layer to cause planarization of the topmost layer. As illustrated in FIG. 13, the film layer, the planarizing block layer and the topmost layer, which is unpatterned layer 20, have been etched such that the unpatterned planarizing film layer 62 and planarizing block layer 60 have disappeared. Portions of these layers could, however, remain without departing from the scope or the teachings of the present invention. The result of this etching step is that unpatterned layer 20 is now substantially planar both locally and globally.

FIG. 14 thus illustrates a portion of an integrated circuit 10 comprising a substrate 12 and a plurality of patterned layers formed on the substrate using a pattern mask associated with each of the patterned layers. A plurality of unpatterned layers is interleaved between the patterned layers including a second unpatterned layer 20 on top of at least two patterned layers and at least one additional unpatterned layer wherein the second unpatterned layer 20 has been globally planarized. This layer was planarized by combining the pattern masks to form a planarizing block mask, forming a planarizing block layer on top of the first unpatterned layer using the planarizing block mask, forming an unpatterned planarizing film layer on top of the planarizing block layer, and etching the film layer, block layer and second unpatterned layer 20 at a similar rate. In addition, the integrated circuit will have at least one additional layer 64 formed on top of the second unpatterned layer 20.

Although the present invention and its advantages have been described in detail, it should be understood that various changes, substitutions and alterations can be made therein without departing from the spirit and scope of the invention as defined by the appended claims.

What is claimed is:

1. A method for performing global planarization of the top layer of a structure having multiple patterned layers, during fabrication of an integrated circuit having a plurality of patterned layers interleaved with a plurality of unpatterned layers wherein each of said patterned layers is associated with a pattern mask and wherein one of the layers is a topmost layer, comprising the steps of:

forming a planarizing block mask, said planarizing block mask being a combined weighted inverse spatial interpolation of each said pattern mask, said planarizing block mask being formed by ANDing the inverse of each of said pattern masks with an associated layer template mask to form weighted inverse masks and overlaying said weighted inverse masks;

forming a planarizing block layer on top of said topmost layer using said planarizing block mask;

forming an unpatterned planarizing film layer on top of said planarizing block layer; and etching said unpatterned planarizing film layer, said planarizing block layer, and said topmost layer to cause planarization of said topmost layer.

2. The method of claim 1 wherein said step of forming a planarizing block mask comprises the steps of:

creating a global template mask comprising a grid of similarly shaped units wherein each said unit has been subdivided into a plurality of subunits, wherein each unit has at least one subunit associated with each patterned layer and wherein each subunit is associated with only one patterned layer;

creating layer template mask associated with each said patterned layer, said layer template mask for a specific patterned layer comprising a series of boolean values associated with each said subunit of said global template mask wherein all boolean values in a layer template mask have a value of false except for boolean values associated with those subunits that were associated with said specific patterned layer when creating said global template mask;

creating said weighted inverse masks, said weighted inverse masks created for a particular patterned layer by taking the logical 'and' between the inverse of said pattern mask and said layer template mask associated with said particular patterned layer; and summing said weighted inverse masks to form said planarizing block mask.

3. The method of claim 1 wherein said step of forming a planarizing block mask comprises the steps of:

creating a global template mask comprising a grid of similarly shaped units wherein each said unit has been subdivided into a plurality of subunits, wherein each unit has at least one subunit associated with each patterned layer and wherein each subunit is associated with only one patterned layer and wherein said similarly shaped units are rectangles;

creating a layer template mask associated with each said patterned layer, said layer template mask for a specific patterned layer comprising a series of boolean values associated with each said subunit of said global template mask wherein all boolean values in a layer template mask have a value of false except for boolean values associated with those subunits that were associated with said specific patterned layer when creating said global template mask;

creating said weighted inverse mask, said weighted inverse mask created for a particular patterned layer by taking the logical 'and' between the inverse of said pattern mask and said layer template mask associated with said particular patterned layer; and summing said weighted inverse masks to form said planarizing block mask.

4. The method of claim 1 wherein said step of forming a planarizing block mask comprises the steps of:

creating a global template mask comprising a grid of similarly shaped units wherein each said unit has been subdivided into a plurality of subunits, wherein each unit has at least one subunit associated with each patterned layer and wherein each subunit is associated with only one patterned layer and wherein said subunits have equal area;

creating a layer template mask associated with each said patterned layer, said layer template mask for a specific patterned layer comprising a series of boolean values associated with each said subunit of said global template mask wherein all boolean values in a layer template mask have a value of false except for boolean values associated with those subunits that were associated with said specific patterned layer when creating said global template mask;

creating said weighted inverse mask, said weighted inverse mask created for a particular patterned layer by taking the logical 'and' between the inverse of said pattern mask and said layer template mask associated with said particular patterned layer; and summing said weighted inverse masks to form said planarizing block mask.

5. The method of claim 1 wherein said step of forming a planarizing block mask comprises the steps of:

creating a global template mask comprising a grid of similarly shaped units wherein each said unit has been subdivided into a plurality of subunits, wherein each unit has at least one subunit associated with each patterned layer and wherein each subunit is associated with only one patterned layer wherein said subunits have an area proportional to the area of said unit such that the ratio of the area of a particular subunit to the area of said unit is substantially equal to the ratio of the thickness of the patterned layer with which said particular subunit is associated to the sum of the thicknesses of said plurality of patterned layers;

creating a layer template mask associated with each said patterned layer, said layer template mask for a specific patterned layer comprising a series of boolean values associated with each said subunit of said global template mask wherein all boolean values in a layer template mask have a value of false except for boolean values associated with those subunits that were associated with said specific patterned layer when creating said global template mask;

creating said weighted inverse mask, said weighted inverse mask created for a particular patterned layer by taking the logical 'and' between the inverse of said pattern mask and said layer template mask associated with said particular patterned layer; and summing said weighted inverse masks to form said planarizing block mask.

6. The method of claim 1 wherein said step of forming a planarizing block mask comprises the steps of:

creating a global template mask comprising a grid of similarly shaped units wherein each said unit has been subdivided into a plurality of subunits, wherein each unit has at least one subunit associated with each patterned layer and wherein each subunit is associated with only one patterned layer;

creating a layer template mask associated with each said patterned layer, said layer template mask for a specific patterned layer comprising a series of boolean values associated with each said subunit of said global template mask wherein all boolean values in a layer template mask have a value of false except for boolean values associated with those subunits that were associated with said specific patterned layer when creating said global template mask;

creating said weighted inverse mask, said weighted inverse mask created for a particular patterned layer by taking the logical 'and' between the inverse of said pattern mask and said layer template mask associated with said particular patterned layer;

summing said weighted inverse masks to form a planarizing block mask; and wherein step of taking the inverse of said pattern masks further comprises the steps of:

enlarging positive areas on each of said patterned masks to form enlarged masks; and taking the inverse of said enlarged masks to form inverse masks.

7. A method for performing global planarization of the top layer of a structure having multiple patterned layers, during fabrication of an integrated circuit having a plurality of patterned layers interleaved with a plurality of unpatterned layers wherein each of said patterned layers is associated with a pattern mask and wherein one of the layers is a topmost layer, comprising the steps of;

creating a weighted spatial interpolation of each of said pattern masks;

taking the inverse of each of said weighted spatial interpolations to form inverse interpolation masks;

forming a planarizing block mask by multiplying said inverse interpolation masks;

forming a planarizing block layer on top of said topmost layer using said planarizing block mask;

forming an unpatterned planarizing film layer on top of said planarizing block layer; and etching said unpatterned planarizing film layer, said planarizing block layer, and said topmost layer to cause planarization of said topmost layer.

8. The method of claim 7 wherein said step of creating a weighted spatial interpolation of each of said pattern masks comprises the steps of:

creating a global template mask comprising a grid of similarly shaped units, wherein each said unit has been subdivided into a plurality of subunits, wherein each unit has at least one subunit associated with each patterned layer, and wherein each subunit is associated with only one patterned layer;

creating a layer template mask associated with each said patterned layer, said layer template mask for a specific patterned layer comprising a series of boolean values associated with each said subunit of said global template mask wherein all boolean values in a layer template mask have a value of false except for boolean values associated with those subunits that were associated with said specific patterned layer when creating said global template mask; and creating a weighted spatial interpolation of each said pattern mask, said weighted spatial interpolation created for a particular patterned layer by taking the logical 'and' between the pattern mask and the layer template mask associated with said particular patterned layer.

9. The method of claim 7 wherein said step of creating a weighted spatial interpolation of each of said pattern masks comprises the steps of:

creating a global template mask comprising a grid of similarly shaped units, wherein each said unit has been subdivided into a plurality of subunits, wherein each unit has at least one subunit associated with each patterned layer, and wherein each subunit is associated with only one patterned layer wherein said similarly shaped units are rectangles;

creating a layer template mask associated with each said patterned layer, said layer template mask for a specific patterned layer comprising a series of boolean values associated with each said subunit of said global template mask wherein all boolean values in a layer template mask have a value of false except for boolean values associated with those subunits that were associated with said specific patterned layer when creating said global template mask; and creating a weighted spatial interpolation of each said pattern mask, said weighted spatial interpolation created for a particular patterned layer by taking the logical 'and' between the pattern mask and the layer template mask associated with said particular patterned layer.

10. The method of claim 7 wherein said step of creating a weighted spatial interpolation of each of said pattern masks comprises the steps of:

creating a global template mask comprising a grid of similarly shaped units, wherein each said unit has been subdivided into a plurality of subunits, wherein each unit has at least one subunit associated with each patterned layer, and wherein each subunit is associated with only one patterned layer wherein said subunits have equal area;

creating a layer template mask associated with each said patterned layer, said layer template mask for a specific patterned layer comprising a series of boolean values associated with each said subunit of said global template mask wherein all boolean values in a layer template mask have a value of false except for boolean values associated with those subunits that were associated with said specific patterned layer when creating said global template mask; and creating a weighted spatial interpolation of each said pattern mask, said weighted spatial interpolation created for a particular patterned layer by taking the logical 'and' between the pattern mask and the layer template mask associated with said particular patterned layer.

11. The method of claim 7 wherein said step of creating a weighted spatial interpolation of each of said pattern masks comprises the steps of:

creating a global template mask comprising a grid of similarly shaped units, wherein each said unit has been subdivided into a plurality of subunits, wherein each unit has at least one subunit associated with each patterned layer, and wherein each subunit is associated with only one patterned layer and wherein said subunits have an area proportional to the area of said unit such that the ratio of the area of a particular subunit to the area of said unit is approximately equal to the ratio of the thickness of the patterned layer with which said particular subunit is associated to the sum of the thicknesses of said plurality of patterned layers;

creating a layer template mask associated with each said patterned layer, said layer template mask for a specific patterned layer comprising a series of boolean values associated with each said subunit of said global template mask wherein all boolean values in a layer template mask have a value of false except for boolean values associated with those subunits that were associated with said specific patterned layer when creating said global template mask; and creating a weighted spatial interpolation of each said pattern mask, said weighted spatial interpolation created for a particular patterned layer by taking the logical 'and' between the pattern mask and the layer template mask associated with said particular patterned layer.

12. A method for performing global planarization of the top layer of a structure having multiple patterned layers, during fabrication of an integrated circuit having a plurality of patterned layers interleaved with a plurality of unpatterned layers wherein each of said patterned layers is associated with a pattern mask and wherein one of the layers is a topmost layer, comprising the steps of:

combining said pattern masks to form a planarizing block mask said combining step further comprising, summing a weighted spatial interpolation of each said pattern mask to form an intermediate mask;

taking the inverse of said intermediate mask to form said planarizing block mask;

forming a planarizing block layer on top of said topmost layer using said planarizing block mask;

forming an unpatterned planarizing film layer on top of said planarizing block layer; and etching said unpatterned planarizing film layer, said planarizing block layer, and said topmost layer to cause planarization of said topmost layer.

13. The method of claim 12 wherein the summing step comprises the steps of:

creating a global template mask comprising a grid of similarly shaped units wherein each said unit has been subdivided into a plurality of subunits wherein each unit has at least one subunit associated with each patterned layer and wherein each subunit is associated with one and only one patterned layer;

creating a layer template mask associated with each said patterned layer, said layer template mask for a specific patterned layer consisting of a series of boolean values associated with each said subunit of said global template mask wherein all boolean values in a layer template mask have a value of false except for said boolean values associated with said subunits that were associated with said specific patterned layer when creating said global template mask;

creating a weighted spatial interpolation of each said pattern mask, said weighted spatial interpolation created for a particular patterned layer by taking the logical 'and' between the pattern mask and the layer template mask associated with said particular patterned layer; and summing said weighted spatial interpolations to form an intermediate mask.

14. The method of claim 13 wherein said similarly shaped units are rectangles.

15. The method of claim 13 wherein said subunits have equal area.

16. The method of claim 13 wherein said subunits have an area proportional to the area of said unit such that the ratio of the area of a particular subunit to the area of said unit is approximately equal to the ratio of the thickness of the patterned layer with which said particular subunit is associated to the sum of the thicknesses of said plurality of patterned layers.

* * * * *